United States Patent
Chou et al.

(10) Patent No.: US 7,554,208 B2
(45) Date of Patent: Jun. 30, 2009

(54) WIREBOND PAD FOR SEMICONDUCTOR CHIP OR WAFER

(75) Inventors: Mark Chou, Kaohsiung (TW); Michael Chen, Tainan (TW); Mou-Shiung Lin, Hsinchu (TW); Chien-Kang Chou, Tainan Hsien (TW)

(73) Assignee: Megica Corp., Hsinchu (TW)

( * ) Notice: Subject to any disclaimer, the term of this patent is extended or adjusted under 35 U.S.C. 154(b) by 0 days.

(21) Appl. No.: 11/756,620

(22) Filed: May 31, 2007

(65) Prior Publication Data

US 2007/0252281 A1    Nov. 1, 2007

Related U.S. Application Data

(63) Continuation of application No. 10/796,427, filed on Mar. 9, 2004, now Pat. No. 7,470,997.

(51) Int. Cl.
*H01L 23/48* (2006.01)
*H01L 23/52* (2006.01)
*H01L 29/40* (2006.01)
(52) U.S. Cl. .................... 257/781; 257/780; 257/784
(58) Field of Classification Search ................ 257/737, 257/738, 758, 780, 784, 786, 781
See application file for complete search history.

(56) References Cited

U.S. PATENT DOCUMENTS

| | | | |
|---|---|---|---|
| 6,383,916 B1* | 5/2002 | Lin | 438/637 |
| 6,878,633 B2* | 4/2005 | Raskin et al. | 438/694 |
| 2005/0017361 A1* | 1/2005 | Lin et al. | 257/756 |

* cited by examiner

*Primary Examiner*—Monica Lewis

(57) ABSTRACT

In the present invention, copper interconnection with metal caps is extended to the post-passivation interconnection process. Metal caps may be aluminum. A gold pad may be formed on the metal caps to allow wire bonding and testing applications. Various post-passivation passive components may be formed on the integrated circuit and connected via the metal caps.

25 Claims, 5 Drawing Sheets

WIREBOND PAD FOR SEMICONDUCTOR CHIP OR WAFER

This application is a continuation application of Ser. No. 10/796,427 filed on Mar. 9, 2004, which claims priority to U.S. Provisional Patent Application Ser. No. 60/489,564, filed on Jul. 23, 2003, both of which are herein incorporated by reference in their entirety.

RELATED PATENT APPLICATIONS

This application is related to Ser. No. 10/154,662, filed on May 24, 2002, and assigned to a common assignee.

This application is related to Ser. No. 10/445,558, filed on May 27, 2003, and assigned to a common assignee.

This application is related to Ser. No. 10/445,559, filed on May 27, 2003, and assigned to a common assignee.

This application is related to Ser. No. 10/445,560, filed on May 27, 2003, and assigned to a common assignee.

BACKGROUND OF THE INVENTION

1. Field of the Invention

This invention relates to structures and methods of assembly of integrated circuit chips. More particularly, this invention relates to post-passivation technologies with metal caps.

2. Description of the Related Art

Copper interconnection requires an aluminum cap at the passivation openings to protect the copper from environmental deterioration such as oxidation from the ambient and to provide a metal pad for wire bonding. Today many integrated circuit chips use copper as the interconnection metal. From a performance perspective, copper interconnection offers a higher propagation speed than does an aluminum interconnection, making copper a desirable technological solution for current IC design. However, copper interconnection also incurs reliability concerns. When a copper I/O pad is exposed to atmosphere, its surface is subjected to chemical attack by the oxygen and moisture in the atmosphere. To overcome this problem, prior art has disclosed a method and structure to prevent copper chemical attack. By depositing a metal (such as aluminum (Al)) cap layer on the surface of the copper I/O pad, the copper I/O pad can remain intact in the passivation opening in the ambient. This metal cap layer is especially important where processing through the passivation layer is performed in one fab and then post-passivation processing is performed in another fab. Moreover, an Al (or other metal) pad is able to form a stable bonding structure with Au wire. Copper alone cannot form a bondable structure with Au wire. Therefore, the Al cap layer provides the wire-bonding capability for the copper I/O pad. FIG. 1 shows an aluminum cap 32 on a copper line 24. The Al cap allows the formation of a wire bond 40 attaching to it firmly. For example, U.S. Pat. No. 6,451,681 to Greer and U.S. Pat. No. 6,376,353 to Zhou teach using an Al cap over a copper bond pad for wire bonding. U.S. Pat. No. 6,544,880 to Akram discloses gold over a copper pad and optionally additional metals to prevent formation of intermetallic compounds in wire bonding.

U.S. Pat. Nos. 6,495,442 and 6,383,916 to M. S. Lin et al disclose a post-passivation interconnection process. The continued emphasis in the semiconductor technology is to create improved performance semiconductor devices at competitive prices. This emphasis over the years has resulted in extreme miniaturization of semiconductor devices, made possible by continued advances of semiconductor processes and materials in combination with new and sophisticated device designs. Most of the semiconductor devices that are at this time being created are aimed at processing digital data. There are however also numerous semiconductor designs that are aimed at incorporating analog functions into devices that simultaneously process digital and analog data, or devices that can be used for the processing of only analog data. One of the major challenges in the creation of analog processing circuitry (using digital processing procedures and equipment) is that a number of the components that are used for analog circuitry are large in size and are therefore not readily integrated into devices that typically have feature sizes that approach the sub-micron range. The main components that offer a challenge in this respect are capacitors and inductors, since both these components are, for typical analog processing circuits, of considerable size.

One of the problems that is encountered when creating an inductor on the surface of a semiconductor substrate is that the self-resonance that is caused by the parasitic capacitance between the (spiral) inductor and the underlying substrate will limit the use of the inductor at high frequencies. As part of the design of such an inductor it is therefore of importance to reduce the capacitive coupling between the created inductor and the underlying substrate. Co-pending U.S. patent application Ser. Nos. 10/445,558, 10/445,559, and 10/445,560 apply the post-passivation process of U.S. Pat. No. 6,383,916 in addition to creating high quality electrical components, such as an inductor, a capacitor or a resistor, on a layer of passivation or on the surface of a thick layer of dielectric.

SUMMARY OF THE INVENTION

An object of this invention is to provide post-passivation interconnection wherein copper pads are capped with metal pads.

Another object of this invention is to provide post-passivation metal interconnection for wire bonding or testing purposes wherein copper pads are capped with a different metal.

A further object is to provide post-passivation metal interconnection for wire bonding or testing purposes wherein copper pads are capped with another metal and further covered with gold.

Another object is to deposit thin film passive components on top of an inductor using copper pads capped with aluminum as the connecting node.

Another object is to attach surface mounted passive components such as capacitors, resistors, and inductors to wirebonds through post-passivation metal lines above the passivation layer.

In accordance with the objects of the invention, a high performance integrated circuit chip is disclosed.

Also in accordance with the objects of the invention, a method of fabricating a high performance integrated circuit chip is achieved.

DETAILED DESCRIPTION OF THE INVENTION

The prior art did not extend the application of a metal cap layer to other useful applications such as post-passivation interconnection or testing through the redistribution layer (RDL). The present invention discloses a structure and method to extend the concept of a metal cap on a copper interconnection to a post-passivation interconnection scheme. In a post passivation processing sequence, as described in copending U.S. patent application Ser. No. 10/154,662 filed on May 24, 2002 and herein incorporated by reference, a thick layer of dielectric is optionally deposited over a layer of passivation and layers of wide and thick metal lines are formed on top of the thick layer of dielectric.

By adding a post-passivation interconnection scheme on a metal (such as Al) pad, where the post-passivation metal is, for example, gold or copper, several advantages emerge. A post-passivation metal trace can be formed either as a stripe or a meander line. When the trace is formed as a stripe, the stripe offers itself as an alternative testing site or as a wire-bonding site for the metal cap. When the trace meanders through several I/O pads, it serves virtually as an alternative interconnection scheme for the IC chip. It is much coarser and hence, faster than is the fine line interconnection line located under the passivation layer. Post-passivation metal also allows one to place passive components such as a capacitor, resistor, or inductor on an IC chip, as taught in co-pending U.S. patent application Ser. No. 10/445,558 to M. S. Lin et al, herein incorporated by reference.

In brief, post-passivation interconnection offers three essential advantages to IC chips: post-passivation interconnection
1) lowers parasitic resistance and capacitance to enhance the speed of the IC chip,
2) facilitates system-on-a-chip (SOC) and system-in-a-package (SIP) design with on-chip passive structures, and
3) allows Au interconnection offering wire bonding capability and testing capability to the IC chip.

When a Au/Al dual cap layer is used as the wire bonding pad on the copper I/O pad, the Au pad provides better performance than does the Al pad because the Au pad bears superior bondability and protection for the active devices. A barrier layer of, for example, TiW is typically formed between the Al cap and the overlying Au.

A Au pad also offers protection for the active devices as described in co-pending U.S. patent application Ser. No. 10/434,142, filed on May 8, 2003, and herein incorporated by reference. This is due mainly to the ductility of gold. When conducting testing or during the wire-bonding process, the gold pad is able to absorb the mechanical energy caused by impetus from a stylus. Thus, the active devices underneath can be protected.

It will be understood by those skilled in the art that the present invention should not be limited to any of the examples shown, but can be extended and applied to any kind of IC chip design.

Figure 1:
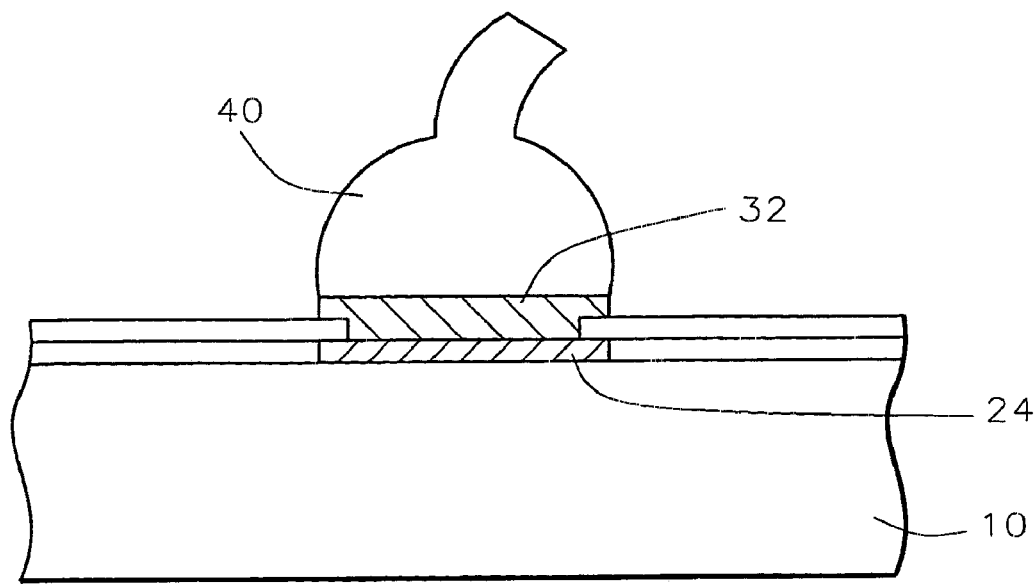
FIG. 1 shows a cross-sectional view of a wire bond of the prior art.
Figure 2:
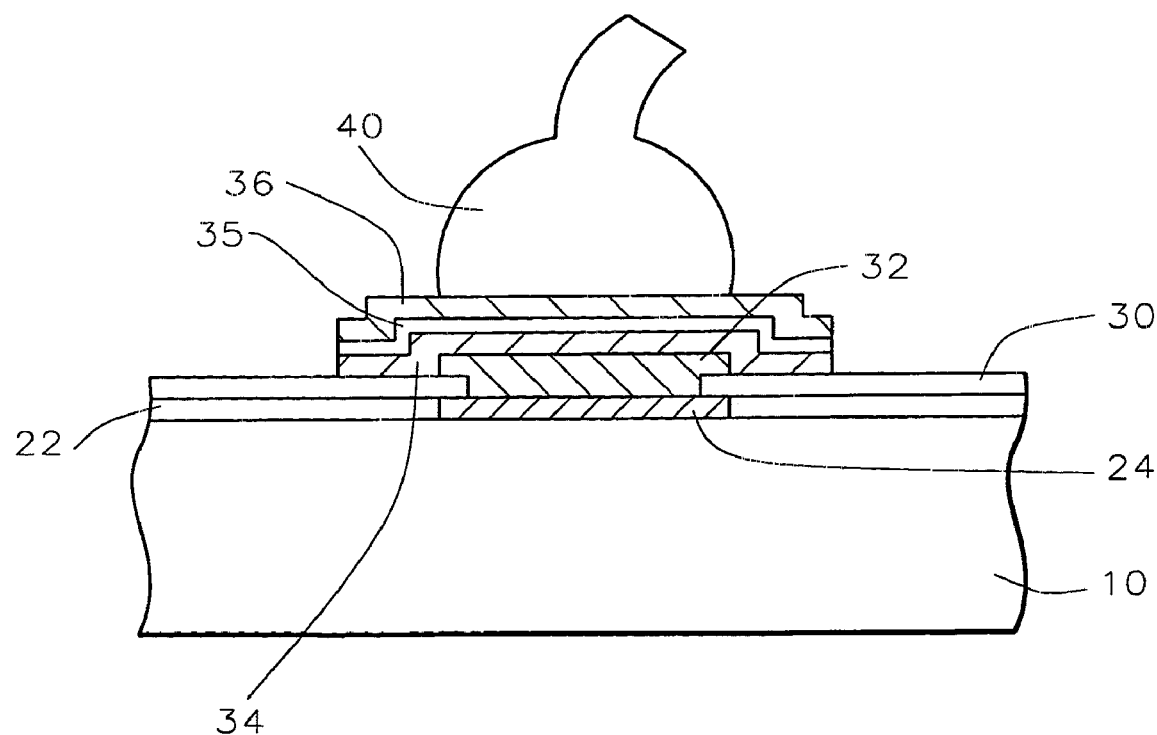
FIG. 2 shows a cross-sectional view of a wire bonding application of the present invention.
Figure 3:
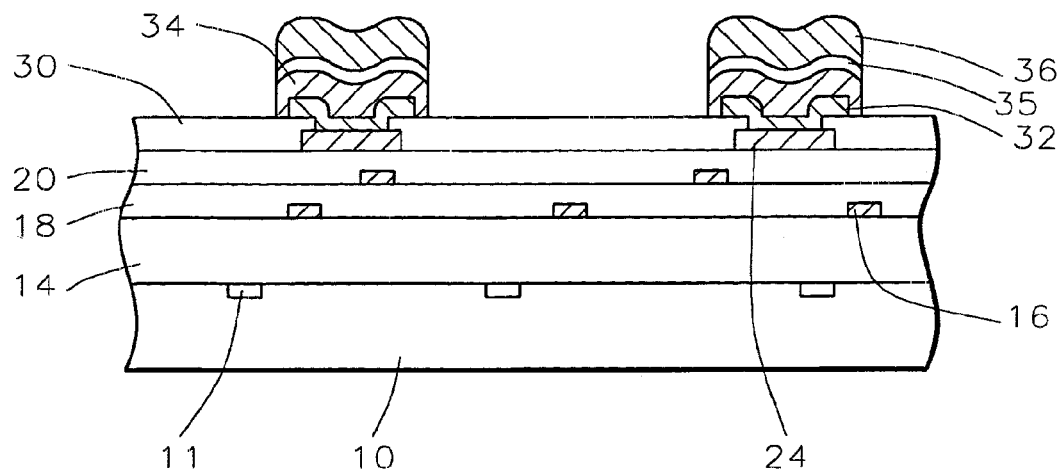
FIG. 3 shows a cross-sectional view of a testing application of the present invention.

Referring now to FIGS. 2 and 3, there is shown an example of a preferred embodiment of the present invention. Semiconductor substrate 10 is shown. Transistors and other devices 11 are formed in and on the semiconductor substrate 10. Multiple layers of conductive lines 16 and dielectric layers 14 are formed over the substrate. On the topmost intermetal dielectric layer 22, a copper contact pad 24 is formed. Passivation layer 30 is formed over the top metal layer 24. The passivation layer is used to protect the underlying devices, such as transistors, polysilicon resistors, poly-to-poly capacitors, and fine-line metal interconnections, not shown and the topmost interlevel dielectric layer from penetration of mobile ions (such as sodium ions), moisture, transition metal (such as gold or silver), and other contaminations. For example, the passivation layer may be a composite of oxide and nitride where the nitride is greater than about 0.3 μm in thickness.

A metal cap layer 32 is formed overlying the copper contact pad 24. An opening is made through the passivation layer to the copper contact pad 24. A metal layer is deposited by physical vapor deposition or by chemical vapor deposition into the opening and over the passivation layer. The metal layer is patterned to form the metal cap 32. The metal cap may be aluminum or an aluminum alloy.

Now, an adhesion/barrier layer 34 is deposited over the passivation layer and metal cap as shown in FIGS. 2 and 3. This adhesion/barrier layer is preferably titanium tungsten (TiW) if the post-passivation bulk metal is Au. For Cu bulk post-passivation, the adhesion/barrier layer is typically Cr, Ti, or TiW. Other possible barrier materials include titanium nitride, tantalum, and tantalum nitride. The adhesion/barrier layer is preferably deposited to a thickness of between about 2700 and 3300 Angstroms.

A gold (Au) or copper (Cu) seed layer 35 is now deposited over the barrier layer 34 by sputtering or electroplating to cover the barrier layer as shown in the figures. The seed layer has a thickness of between about 900 and 1100 Angstroms. The substrate is coated with resist which is exposed and developed by a photolithography process, leaving openings where the metal body is to be formed. Now, the Au or Cu metal body 36 is electroplated on the seed layer 35 to a thickness of between about 2 μm and 20 μm. The resist is removed by an etching process. The barrier/adhesion layer is etched in a self-aligned etch. The barrier/adhesion layer covered by the Au or Cu metal body 36 remains while the barrier/adhesion layer elsewhere is etched away.

Now, Au wire 40 can be bonded to the Au pad 36 as shown in FIG. 2. Or, the copper contact pad 24 with Al cap 32 and Au pad 36 can be used for testing applications, as shown in FIG. 3.

The post-passivation interconnect process has been described in U.S. Pat. No. 6,383,916. The following figures illustrate the application of a metal cap with the post-passivation interconnect process.

Figure 4A:
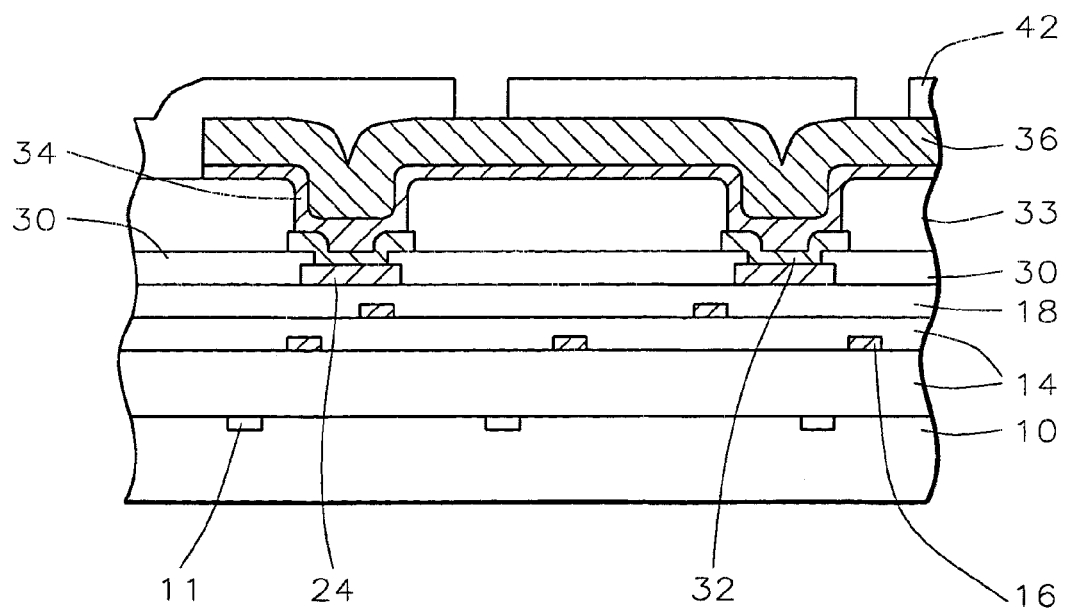
FIGS. 4A and 4B show cross-sectional views of a preferred embodiment of the present invention having a single post-passivation interconnect layer.

Referring now to FIG. 4A, there is shown a cross section of one implementation of U.S. Pat. No. 6,383,916 and the present invention. The surface of silicon substrate 10 has been provided with transistors 11 and other devices. The surface of substrate 10 is covered by interlevel dielectric (ILD) layers and intermetal dielectric layers (IMD) 14 and 18 formed over the devices.

Dielectric layers 14 and 18 contain one or more layers of dielectric, interspersed with one or more metal interconnect lines 16 that make up a network of electrical connections. At a topmost metal layer are points of electrical contact such as contact pads 24. A passivation layer 30, formed of, for example, a composite layer of silicon oxide and silicon nitride, is deposited over the surface of layer 18, and functions to prevent the penetration of mobile ions (such as sodium ions), moisture, transition metal (such as gold, silver), and other contamination. The passivation layer is used to protect the underlying devices (such as transistors, polysilicon resistors, poly-to-poly capacitors, etc.) and the fine-line metal interconnection.

Now, a metal (such as Al or an aluminum alloy) layer is deposited into the opening and over the passivation layer. The metal layer is patterned to form the metal cap 32.

A post-passivation interconnect dielectric layer 33 optionally is deposited over the passivation layer 20 and the Al metal layer 24. This dielectric layer 33 is preferably polyimide, BCB, a low dielectric constant (k) dielectric material, or an elastomer having a thickness of between about 2 μm and 20 μm through photolithographic process steps. Now, openings are made through the dielectric layer 33 to the metal caps 24.

Now, an adhesion/barrier layer 34 is deposited over the dielectric layer 33 and metal cap 24. This adhesion/barrier layer is preferably titanium tungsten (TiW). Other possible materials are TiN and TaN.

As described above, a gold (Au) or other metal is now electroplated to form metal pads 36 as shown in the FIG. 4A. For example, the 36 may be a gold meander line, shown connecting the two pads which allows the chip to conduct wire-bonding or testing without damaging the active devices. As both the Au layer and the dielectric layer 33 are able to absorb the mechanical shock caused by the poking process during testing or wire-bonding, damage to the active devices can be avoided.

Figure 4B:
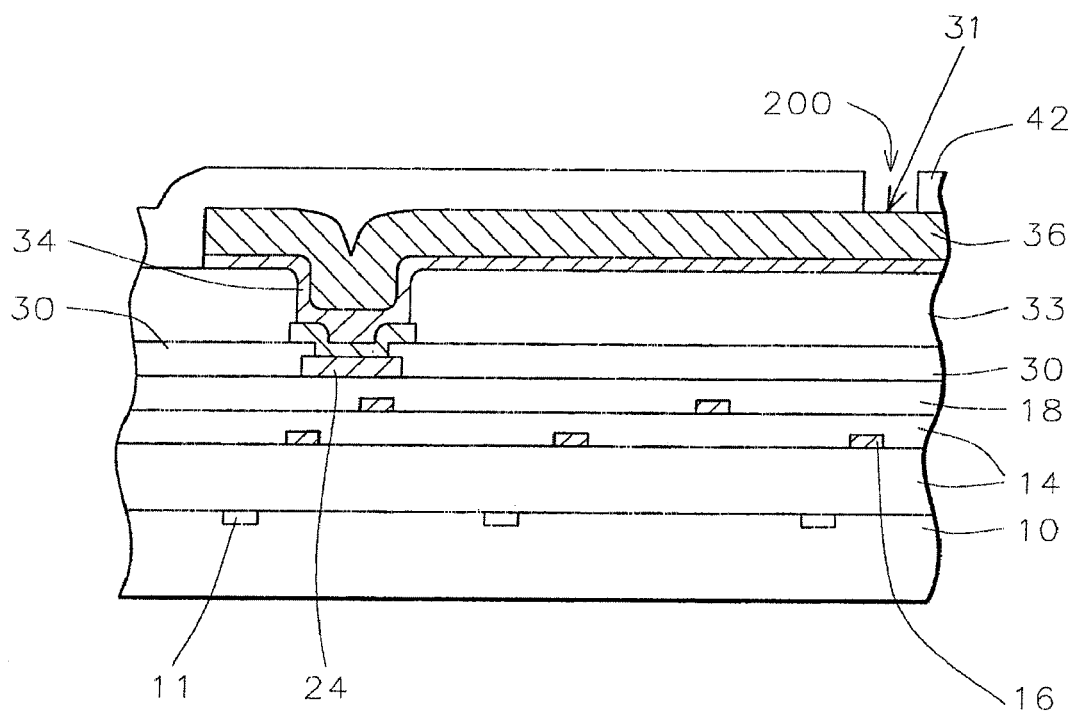

FIG. 4B shows another use of the gold pad. The gold may be used for pad relocation. For example, as shown in FIG. 4B, the gold line 36 is connected to the metal pad 24. The gold line 36 is extended away from the metal pad 24. A dielectric layer 42 is deposited overlying the gold line 36. An opening 200 may be made to the gold line 36. A wirebond can be formed at the relocation point 31 (contact point). The region 31 of the extended gold pad could be used for a test probe.

Figure 5:
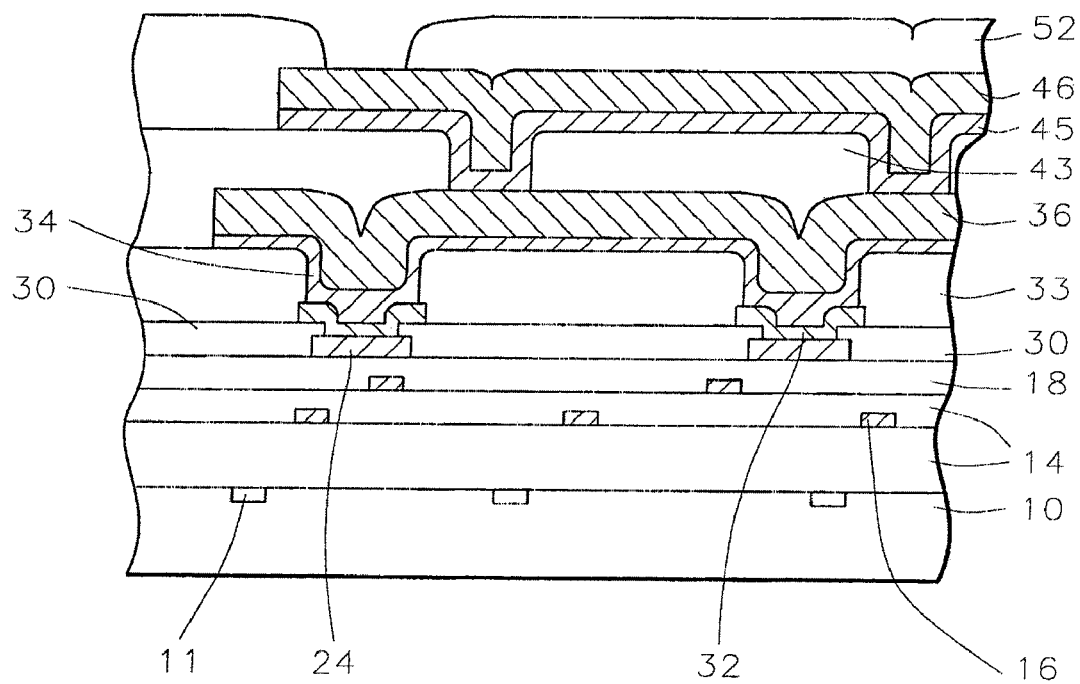
FIG. 5 shows a cross-sectional view of a preferred embodiment of the present invention having multiple post-passivation interconnect layers.

FIG. 5 shows another embodiment of the present invention. In this embodiment, after the metal line 36 is formed, a second post-passivation layer 43 is deposited over the metal line 36. Openings are made through the second dielectric layer 43 to the metal line 36. Now, an adhesion/barrier layer 45 is deposited over the dielectric layer 43 and within the openings. A gold (Au) or other metal layer is now formed in a similar manner to line 36 in FIG. 4 over the barrier layer 45 to form the metal line 46 as shown in the FIG. 5.

Figure 6:
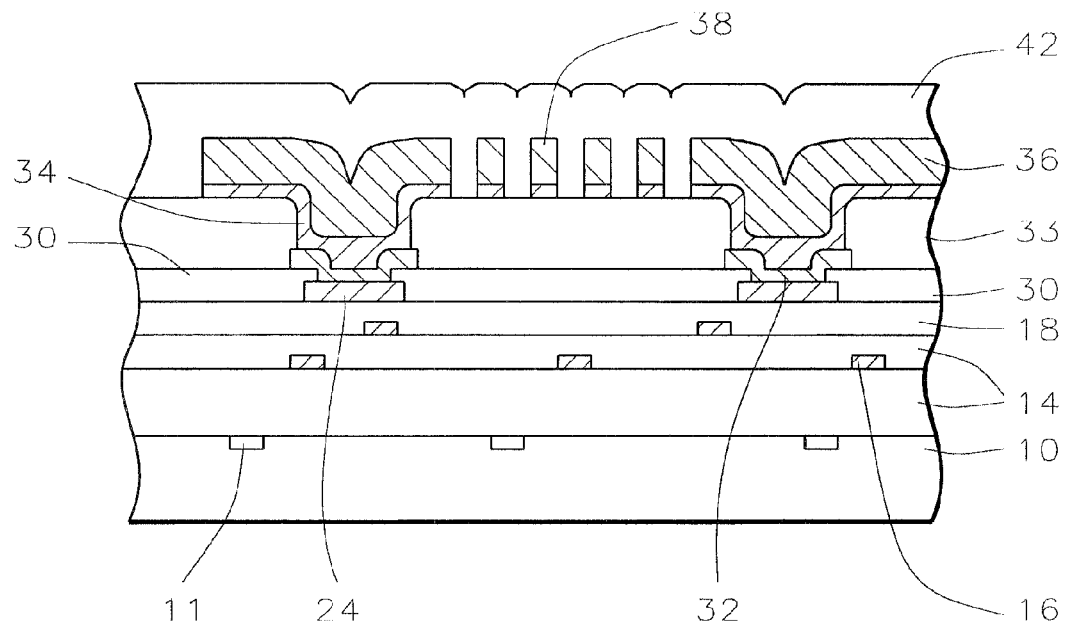
FIG. 6 shows a cross-sectional view of a preferred embodiment of the present invention including an inductor.

The process of the present invention can be used in forming a variety of discrete passive components in the post-passivation process. For example, FIG. 6 illustrates an inductor 38 formed from the metal layer 36 and barrier layer 34. Shown are metal lines 36 and inductor 38.

Figure 7:
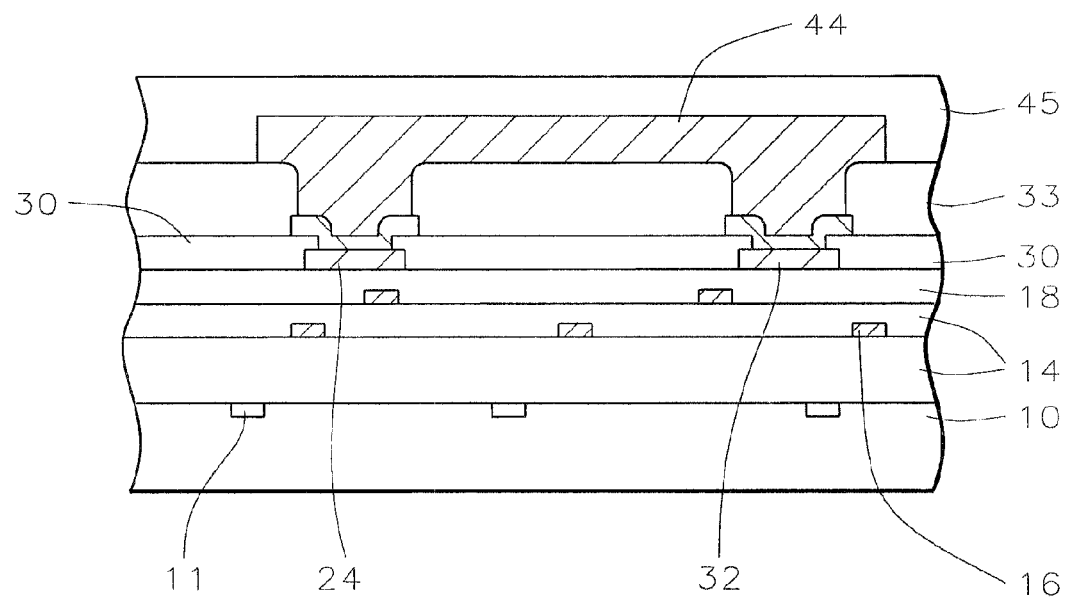
FIG. 7 shows a cross-sectional view of a preferred embodiment of the present invention including a resistor.

FIG. 7 illustrates the formation of a resistor 44. Dielectric layer 33 has been formed over the passivation layer 30 and Al or other metal caps 32. Openings are made through the dielectric layer 33 to the pads 24 having metal caps 32. A metal layer over the dielectric layer and within the openings forms the resistor 44. Optionally, a post-passivation layer 45 may be formed over the resistor 44.

Figure 8:
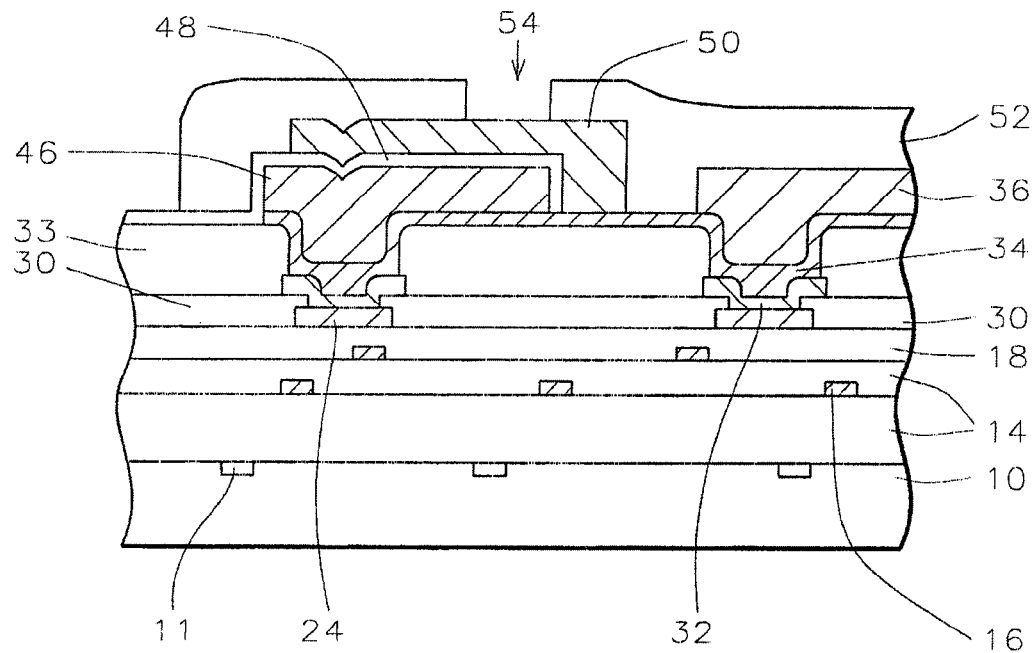
FIG. 8 shows a cross-sectional view of a preferred embodiment of the present invention including a capacitor formed by a first alternative process.

FIG. 8 illustrates the formation of a capacitor. Dielectric layer 33 has been formed over the passivation layer 30 and Al or other metal caps 32. Openings are made through the dielectric layer 33 to the pads 24 having metal caps 32. Adhesion/barrier layer 34 is deposited over the passivation layer and within the openings. A metal layer over the barrier layer 34 forms the metal line 36 and the bottom electrode of the capacitor 46. A capacitor dielectric layer 48 is deposited and etched away to leave the capacitor dielectric layer 48 on the top and sidewalls of the bottom electrode 46. A second conducting layer is used to form the top capacitor electrode 50 to complete formation of the capacitor.

A dielectric layer 52 is deposited overlying the capacitor and the metal line 36. An opening 54 is made through the dielectric layer 52 to the top electrode 50 for wire bonding or solder bonding.

Figure 9:
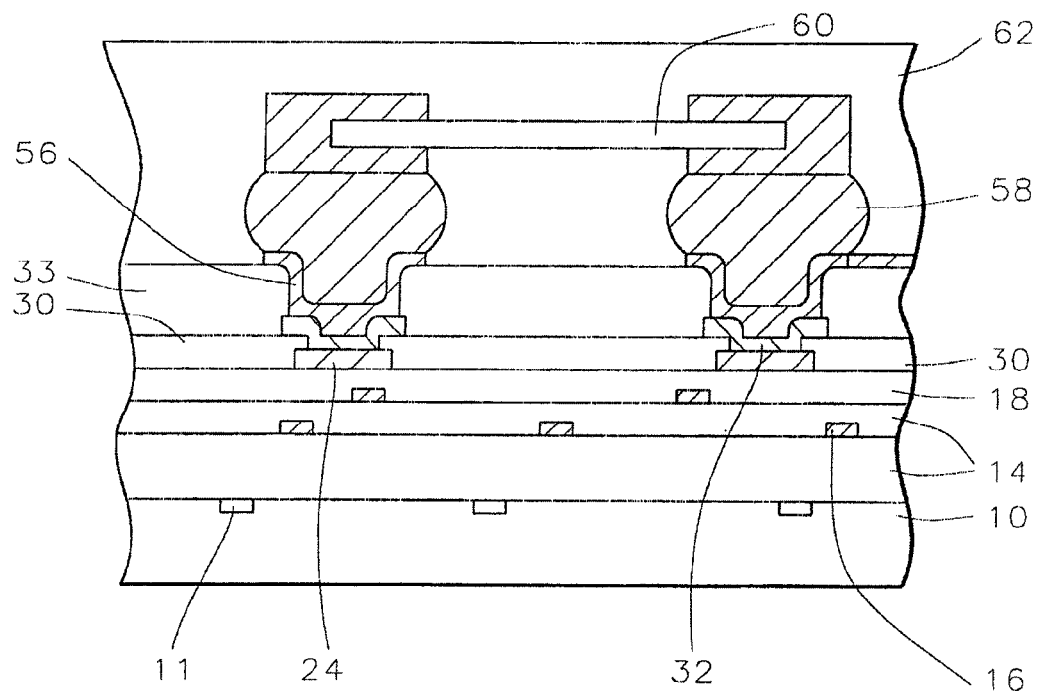
FIG. 9 shows a cross-sectional view of a preferred embodiment of the present invention including a capacitor formed by a second alternative process.

In another alternative, commercially available discrete capacitors are used. These capacitors have already been coated with solder at both ends (terminals or electrodes). Therefore, on the IC wafer, dielectric layer 33 is formed over the passivation layer 30 and Al or other metal caps 32. Openings are made through the dielectric layer 33 to the pads 24 having metal caps 32. A barrier or wetting layer 56 is deposited over the passivation layer and patterned to leave the wetting layer within and immediately surrounding the openings. Solder balls 58 are formed within and over the openings as shown in FIG. 9. The discrete capacitor 60 is attached to the IC by the solder balls 58. A dielectric layer 62 is deposited to cover the capacitor 60. Other discrete passive components can be surface mounted over the passivation layer in a similar manner.

While this invention has been particularly shown and described with reference to the preferred embodiments thereof, it will be understood by those skilled in the art that various changes in form and details may be made without departing from the spirit and scope of the invention.

The invention claimed is:

1. A semiconductor chip comprising:
   a silicon substrate;
   a transistor in and on said silicon substrate;
   a first dielectric layer over said silicon substrate;
   an interconnecting metallization structure over said first dielectric layer, wherein said interconnecting metallization structure comprises a first metal layer, a second metal layer over said first metal layer, and a copper pad having a top surface and a sidewall, wherein said top surface has a first region and a second region between said sidewall and said first region;
   a second dielectric layer between said first and second metal layers;
   a passivation layer over said interconnecting metallization structure, on said second region and over said first and second dielectric layers, wherein an opening in said passivation layer is over said first region, and said first region is at a bottom of said opening in said passivation layer, and wherein said passivation layer comprises an insulating nitride;
   an aluminum cap comprising a first portion directly over said first region and a second portion directly over said passivation layer, wherein said aluminum cap is connected to said copper pad through said opening in said passivation layer, and wherein said aluminum cap has a width greater than that of said opening in said passivation layer;
   an adhesion/barrier layer on said aluminum cap; and
   a gold layer on said adhesion/barrier layer and directly over said first and second portions of said aluminum cap, wherein said gold layer comprises a gold seed layer and an electroplated gold layer on said gold seed layer, wherein said electroplated gold layer has a thickness between 2 and 20 micrometers and wherein said electroplated gold layer is connected to said copper pad through said gold seed layer, said adhesion barrier/layer, and said aluminum cap.

2. The semiconductor chip of claim 1, wherein said adhesion/barrier layer comprises titanium.

3. The semiconductor chip of claim 1, wherein said adhesion/barrier layer comprises a titanium-tungsten alloy.

4. The semiconductor chip of claim 1, wherein said adhesion/barrier layer comprises titanium nitride.

5. The semiconductor chip of claim 1, wherein said adhesion/barrier layer comprises tantalum.

6. The semiconductor chip of claim 1, wherein said gold layer is used to be tested thereto.

7. The semiconductor chip of claim 1, wherein said passivation layer further comprises an oxide.

8. The semiconductor chip of claim 1, wherein said insulating nitride has a thickness greater than 0.3 micrometers.

9. A semiconductor chip comprising:
a silicon substrate;
a transistor in and on said silicon substrate;
a first dielectric layer over said silicon substrate;
an interconnecting metallization structure over said first dielectric layer, wherein said interconnecting metallization structure comprises a first metal layer, a second metal layer over said first metal layer, and a copper pad having a top surface and a sidewall, wherein said top surface has a first region and a second region between said sidewall and said first region;
a second dielectric layer between said first and second metal layers;
a passivation layer over said interconnecting metallization structure, on said second region and over said first and second dielectric layers, wherein an opening in said passivation layer is over said first region, and said first region is at a bottom of said opening in said passivation layer, and wherein said passivation layer comprises an insulating nitride;
an adhesion/barrier layer over said first region and over said passivation layer; and
a gold layer on said adhesion/barrier layer, wherein said gold layer comprises a gold seed layer and an electroplated gold layer on said gold seed layer, wherein said electroplated gold layer has a thickness between 2 and 20 micrometers, electroplated wherein said gold layer is connected to said copper pad through said gold seed layer and said adhesion barrier/layer and through said opening in said passivation layer, and wherein said gold layer comprises a first portion directly over said first region and a second portion directly over said passivation layer.

10. The semiconductor chip of claim 9, wherein said adhesion/barrier layer comprises titanium.

11. The semiconductor chip of claim 9, wherein said adhesion/barrier layer comprises a titanium-tungsten alloy.

12. The semiconductor chip of claim 9, wherein said adhesion/barrier layer comprises titanium nitride.

13. The semiconductor chip of claim 9, wherein said adhesion/barrier layer comprises tantalum.

14. The semiconductor chip of claim 9, wherein said gold layer is used to be tested thereto.

15. The semiconductor chip of claim 9, wherein said passivation layer further comprises an oxide.

16. The semiconductor chip of claim 9, wherein said insulating nitride has a thickness greater than 0.3 micrometers.

17. The semiconductor chip of claim 9 further comprising a polymer layer on said passivation layer, wherein said adhesion/barrier layer is further on said polymer layer, and wherein said polymer layer has a thickness between 2 and 20 micrometers.

18. The semiconductor chip of claim 17, wherein said polymer layer comprises polyimide.

19. The semiconductor chip of claim 17, wherein said polymer layer comprises BCB.

20. The semiconductor chip of claim 9 further comprising a third dielectric layer on said gold layer, wherein an opening in said third dielectric layer is over said gold layer, and said gold layer comprises a contact point at a bottom of said opening in said third dielectric layer.

21. The semiconductor chip of claim 9, wherein said transistor comprises a portion directly under said gold layer.

22. The semiconductor chip of claim 1 further comprising a polymer layer on said passivation layer, wherein said adhesion/barrier layer is further on said polymer layer, and wherein said polymer layer has a thickness between 2 and 20 micrometers.

23. The semiconductor chip of claim 22, wherein said polymer layer comprises polyimide.

24. The semiconductor chip of claim 1 further comprising a third dielectric layer on said gold layer, wherein an opening in said third dielectric layer is over said gold layer, and said gold layer comprises a contact point at a bottom of said opening in said third dielectric layer.

25. The semiconductor chip of claim 1, wherein said transistor comprises a portion directly under said gold layer.

* * * * *

UNITED STATES PATENT AND TRADEMARK OFFICE
CERTIFICATE OF CORRECTION

PATENT NO. : 7,554,208 B2
APPLICATION NO. : 11/756620
DATED : June 30, 2009
INVENTOR(S) : Mark Chou et al.

It is certified that error appears in the above-identified patent and that said Letters Patent is hereby corrected as shown below:

In the Claims:
Claim 9 at Column 7, Lines 38-39, please replace "between 2 and 20 micrometers, electroplated wherein said gold layer" with -- between 2 and 20 micrometers, wherein said electroplated gold layer --.

Signed and Sealed this

Twenty-eighth Day of September, 2010

David J. Kappos
*Director of the United States Patent and Trademark Office*